(12) United States Patent
Lu

(10) Patent No.: US 6,450,727 B2
(45) Date of Patent: Sep. 17, 2002

(54) AUTOMATIC LOCKING APPARATUS FOR A MOVABLE MODULE IN A DEVICE

(75) Inventor: Jih-Yung Lu, Taipei (TW)

(73) Assignee: Acer Communications & Multimedia Inc. (TW)

( * ) Notice: Subject to any disclaimer, the term of this patent is extended or adjusted under 35 U.S.C. 154(b) by 88 days.

(21) Appl. No.: 09/767,748

(22) Filed: Jan. 24, 2001

(30) Foreign Application Priority Data

Feb. 10, 2000 (TW) ........................................ 89202267 U

(51) Int. Cl.$^7$ ................................................. F16B 7/00
(52) U.S. Cl. ................... 403/322.1; 312/223.2
(58) Field of Search .............................. 403/322.1, 321, 403/322.4, 92, 324, 93, 325, 65, 119, 96, 97; 244/137.4; 16/324, 327, 326; 312/223.2, 222, 215; 292/209, 214

(56) References Cited

U.S. PATENT DOCUMENTS 5,769,515 A * 6/1998 Chang ........................ 292/209
5,973,866 A * 10/1999 Tseng ........................ 359/196
6,065,896 A * 5/2000 Jermyn, Jr. ............... 244/137.4
6,394,687 B1 * 5/2002 Lee ......................... 403/322.1

* cited by examiner

*Primary Examiner*—Robert E. Pezzuto
(74) *Attorney, Agent, or Firm*—Troxell Law Office PLLC

(57) ABSTRACT

An automatic locking apparatus for a movable module in a device uses device's weight and position to lock the movable module. It includes an input unit located on a bottom wall of the device to detect if the device is positioned on a support plane under a normal state, a transfer unit for receiving input from the input unit to generate a response, and an output unit for receiving the response to actuate a lock or unlock action on the movable module. When the input unit detects the device being properly positioned on the support plane, the transfer unit will be triggered to make the output unit disengaged with the movable module for normal operation. When the input unit detects the device being removed from the support plane at an abnormal state, the transfer unit will be triggered to make the output unit locking the movable module inside the device at a selected location.

22 Claims, 5 Drawing Sheets

AUTOMATIC LOCKING APPARATUS FOR A MOVABLE MODULE IN A DEVICE

FIELD OF THE INVENTION

This invention relates to an automatic locking apparatus for a movable module in a device and more particularly to an automatic locking apparatus that employs the gravitational weight of the device itself as the action force for locking or releasing the movable module in the device.

BACKGROUND OF THE INVENTION

In many devices such as a scanner and other similar optical devices, there is usually a movable module for performing scanning, image recognition or other optical and sensing function. These movable modules are usually driven reciprocally within a selected displacement by a particular transmission means such as a belt, a gear rack and the like when in use. When not in use, the movable module is usually set to return to an initial position.

However, due to some reasons such as driving power limitation, weight of the movable module or design deficiency of the transmission means, the movable module might not always have an automatic locking design. In the case that the device does not include an automatic locking device for anchoring the movable module while not in usage, the device might have a substantial high possibility, while moving the device, that the movable module might slip away from its initial position and hit other components in the device. It is obvious that any collision happens to the movable device might lead to some damages, and such damages are definitely unwelcome.

In order to prevent aforesaid problem, there are prior arts to use manual locking means to anchor the movable module at a fixed selected location in the device. U.S. Pat. Nos. 5,769,515 and 5,973,866 are two of these efforts.

Generally, aforesaid prior arts may be well used for a planned movement of the device. However, there are unplanned occasions that the device will be moved incidentally and a non-lock setting might be met due to people's negligence. Under such abnormal situations, the movable module may remain at a unlocking or free-to-slip position, and could result in damage of the device.

SUMMARY OF THE INVENTION

It is an object of this invention to provide an automatic locking apparatus for a movable module in a device that utilizes the location and the gravitational weight of the device to trigger a control means for locking or releasing the movable module.

It is another object of this invention to provide an automatic locking apparatus that will automatically lock a movable module at an initial position when the device is moved away from a resting place and will automatically unlock the movable module when the device is placed on a working location.

In one aspect of the present invention, the device has a bottom wall for resting on a support plane, and the movable module is movable inside the device. The automatic locking apparatus includes an input unit, a transfer unit and an output unit.

The input unit is located on the bottom wall for detecting if the device is posed at a normal state (i.e. resting on the support plane) or an abnormal state (i.e. not being positioned on the support plane).

The transfer unit is located in the device to receive input from the input unit and to trigger an output action.

The output unit is actuated by the transfer unit to lock or release the movable module according to a preset condition. Generally, the movable module will be released under a normal state and locked under an abnormal state.

In one embodiment of this invention, the input unit is a sensor located under the bottom wall. The transfer unit is an electric controller. The output unit is an actuator (such as a solenoid) which has a pin movable to lock or release the movable module. The sensor may have a probe pin to trigger the pin to perform locking or releasing action. This embodiment may include an independent power supply for the apparatus to function normally even when the external power supply is absent.

In another embodiment of the present invention, the transfer unit may include a slide bar and a spring mounted in the bottom wall. The slide bar has a lower end for serving as an input unit passing through the bottom wall to contact the support plane and a lock stub at an upper end for serving as an output unit for locking or releasing the movable module. The spring will trigger the movement of the slide bar for locking or releasing action under an abnormal or a normal condition. The slide bar thereof has a lower limit hook and an upper limit shoulder for limiting the movement of the slide bar within a selected displacement range.

In yet another embodiment of the present invention, the input unit may include an input bar passing through the bottom wall and engaged with a spring held in the bottom wall. The output unit may include an output bar having a free end to form a locking hook. The transfer unit may include a pivotal means to couple the input bar and the output bar, and a lever means for triggering the output bar to lock the movable module under abnormal conditions, or to release the movable module under normal conditions.

In another aspect of the present invention, the locking hook may be replaced by a magnet to mate and attract another magnet located in the movable module under a locking state.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
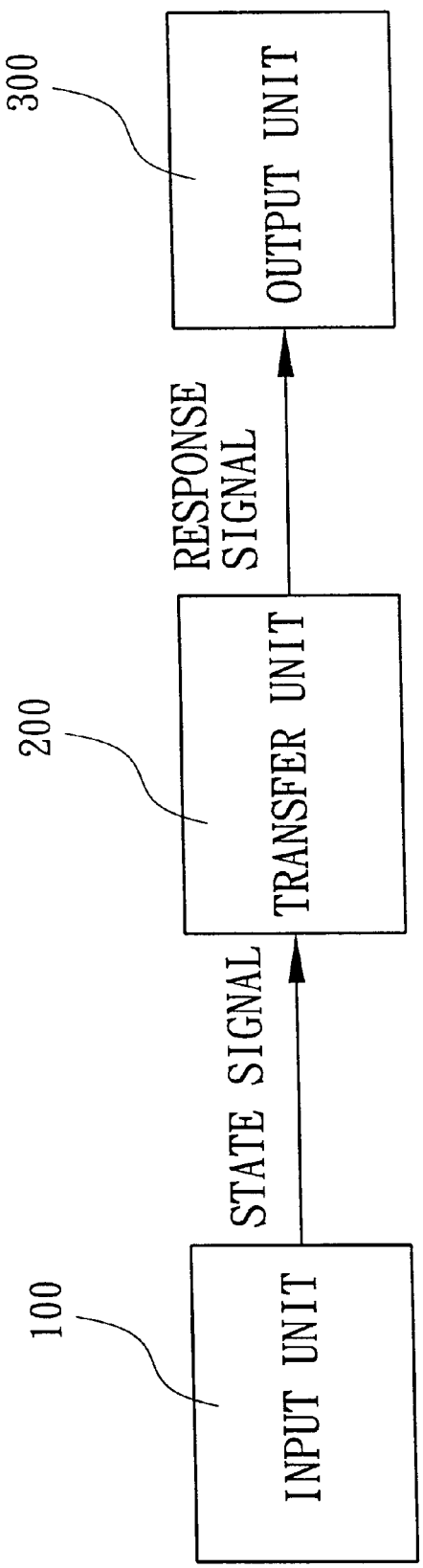
FIG. 1 is a block diagram for operation principle of this invention.

FIG. 1 shows the operation principle of this invention. An input unit 100 is provided to receive device's positional conditions as well as the resting states, and to generate a respective state signal provided to a transfer unit 200 which can then thereby produce a response signal for triggering an output unit 300 to perform an action desired. In the present invention, there are two different types of action:

1. When the device is placed upon a support plane with a normal condition, then the movable module can be operational and movable as a normal state.

2. Under any condition other than the aforesaid state, the movable module will be locked and engaged with the device at a selected position.

The apparatus of this invention may be an electromechanical or mechanical type. The input device 100 may be a sensor, a touch switch, a mechanical displacement element or other signal generators that may produce signals based on displacement change of an electronic, an electrical or a mechanical means. The output unit may be a device for engaging the movable module with the device body such as a latch-pin combination, a key and key way combination, an electromagnetic device and the like.

The transfer unit 200 receives input signal and generates a response signal or action to actuate the output unit. It may include an electric circuit, a mechanical mechanism and the like.

Figure 2:
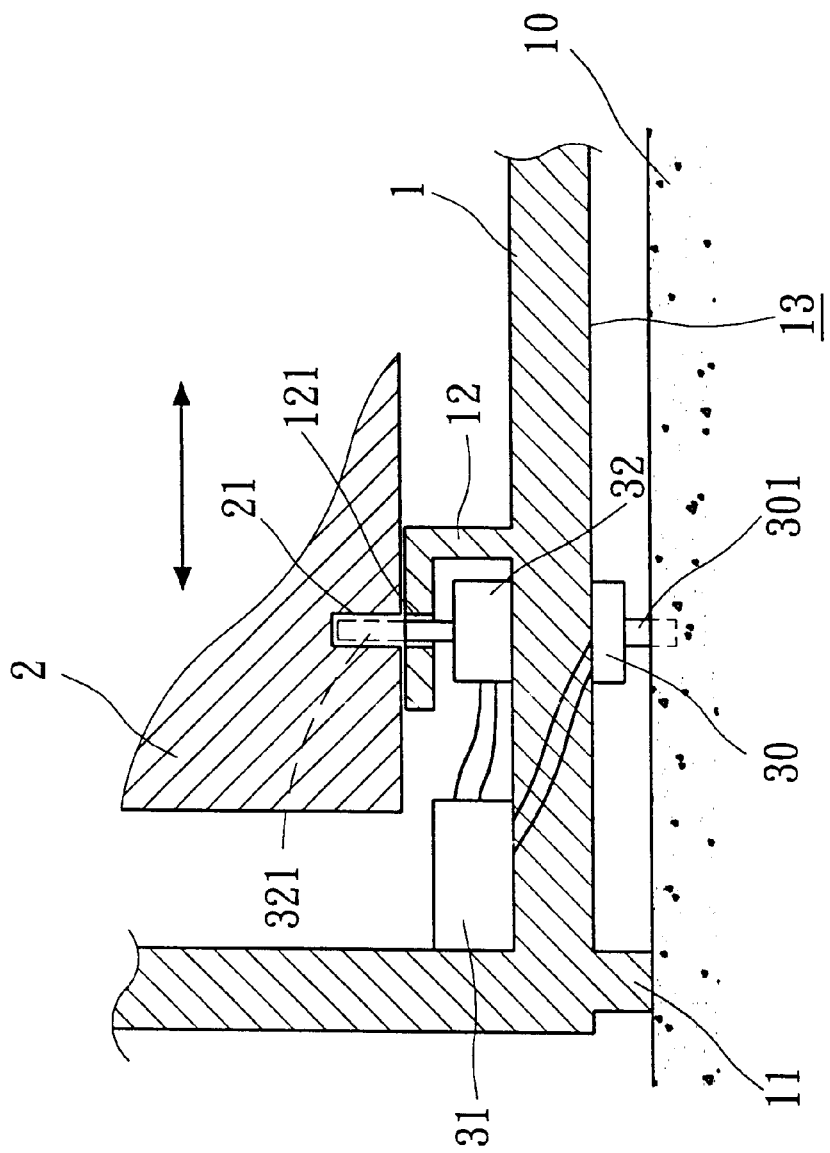
FIG. 2 is a fragmentary sectional view of a first embodiment of this invention.

FIG. 2 shows a first embodiment of this invention. A device has a bottom wall 13 and a plurality of legs 11 (yet, only one being shown in the figure) resting on a support plane 10. Above the bottom wall 13, there is a flange 12 to hold a movable module 2 thereon. The flange 12 has a through hole 121 mating against a locking bore 21 formed in a lower portion of the movable module 2. The input unit 100 (as shown in FIG.1) includes a sensor 30 mounted under the bottom wall 13. The sensor 30 has a probe pin 301 which may be pressed by the support plane 10 and may be withdrawn into the sensor 30 under a normal condition (shown by a solid line as labeled 301 in FIG. 2). The sensor 30 is wired to an electric controller 31 which serves as the transfer unit 200 (as shown in FIG.1). The output unit 300 (as shown in FIG. 1) can be embodied as an actuator 32 such as a solenoid, for example, located in the device 1. The actuator 32 is wired to the electric controller 31 and has a movable lock pin 321.

Under the normal condition, the device is properly rested on the support plane 10 and can then precede normal operation. At this state, the probe pin 301 is pressed and withdrawn inside the sensor 30. A signal will be generated to the electric controller 31 that in turn generates a response signal to the actuator 32 for withdrawing the lock pin 321 (indicated by solid lines in FIG. 2). The movable module 2 is unlocked and free to move inside the device to perform as desired. In the case that the device is right at being moved away from the support plane 10, the probe pin 301 will simultaneously extend out of the sensor 30 and generate another signal to the electric controller 31 which in turn produces a different response signal to the actuator 32 to force the lock pin 321 outward through the hole 121 and into the locking bore 21 (indicated by broken lines in FIG. 2). Then, the movable module 2 will be locked at a desired location inside the device.

In the present invention, the lock pin 321 and locking bore 21 may be shaped as a mating circle pair as described in the embodiment or other mating geometrical shapes desired.

The flange 12 together with the lock pin 321 aims at providing sufficient strength against possible movement of the movable module 2. However, the flange 12 may be omitted if desired. Then, the top surface of the actuator 32 will serve to provide the same purpose.

The sensor 30, controller 31 and actuator 32 may be powered by an independent battery power supply other than the external power supply which might also be used to drive the device 1. This arrangement can make this apparatus operational and effective even when the device is cut off from the external power during moving or transportation.

Figure 3:
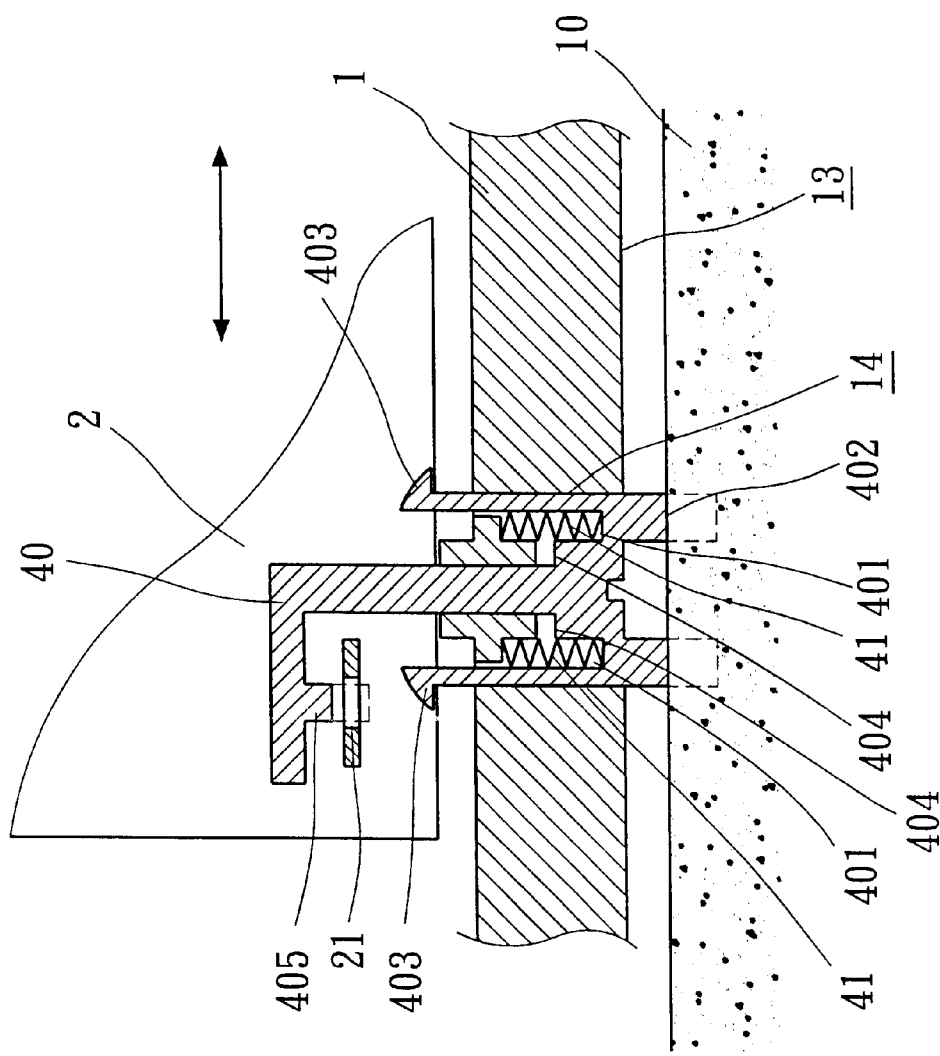
FIG. 3 is a fragmentary sectional view of a second embodiment of this invention.

FIG. 3 shows a second embodiment of this invention. The bottom wall 13 of the device 1 has a cavity 14 in which a slide bar 40 can be housed. The slide bar 40 has a foot 402 at one end extending outside the bottom wall 13 to serve as the input unit for making contact with the support plane 10. Another end of the slide bar 40 is formed as a hook stub 405 extending into the device 1 to serve as the output unit of the present invention. The slide bar 40 in the cavity 14 has a trough 401 for holding at least one spring 41 therein. The slide bar 40 further has a low limit hooks 403 and a high limit shoulder 404 for setting respectively the lowest and the highest dead ends of the slide bar motion. The movable module 2 has a locking bore 21 engageable with the lock stub 405. The transfer unit of the present invention is formed by the cavity 14, the slide bar 40 and the spring 41.

While in use under a normal condition, the device 1 is rested upon the support plane 10. The foot 402 is pressed upward and compresses the spring 41 to store spring energy. The slide bar 40 is pushed upward and moves the lock stub 405 out of the locking bore 21. The movable module 2 is thus free to move and operation. When the device 1 is moved away from the support plane 10, the compressed spring 41 releases the stored energy and pushes the slide bar 41 as well as the foot 402 downward (indicated by broken lines in FIG. 3). The lock stub 405 engages with the locking bore 21 and locks the movable module 2 at a fixed location as desired. This embodiment as shown is obviously one of mechanical embodiments that can operate normally without any electric power.

Figure 4:
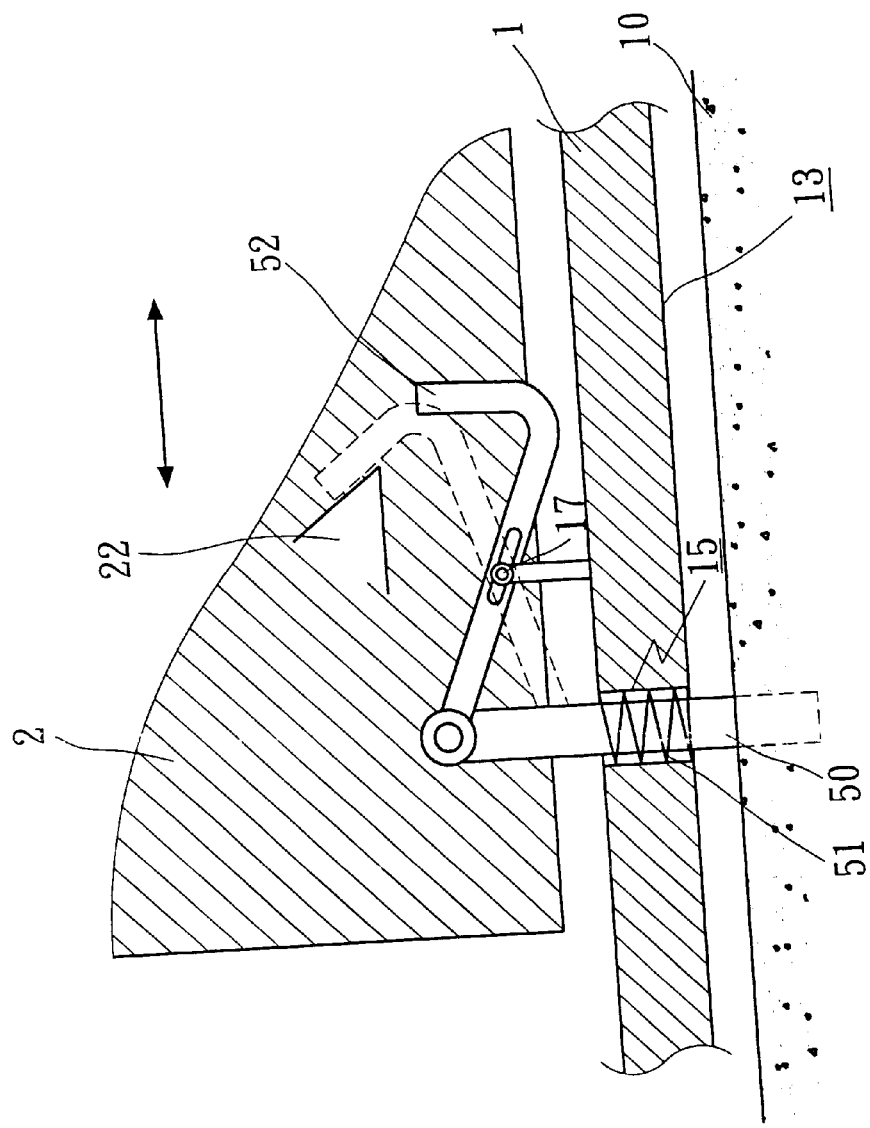
FIG. 4 is a fragmentary sectional view of a third embodiment of this invention.

FIG. 4 shows a third embodiment of this invention. The device 1 has a bottom wall 13 in which an opening 15 is provided. There is an input bar 50 running through the opening 15. In the opening 15, there is a compression spring 51 which has a high end engaged with the bottom wall 13 and a low end engaged with the input bar 50 to push the bottom end of the input bar 50 resting on the supporting plane 10.

Of course, on the other hand, the spring 51 can be embodied as a tension spring to pull the input bar 50 downward through the bottom wall 13. In such a case, the spring 51 has its high end to engage with the input bar 50 and has its low end to engage with the bottom wall 13.

As shown in FIG.4, the top end of the input bar 50 is extended into the device 1 and is pivotally engaged with one end of an output bar 52. The output bar 52 is formed like a lever and has a slot in the middle pivotally engaged with a fulcrum 17. Another end of the output bar 52 can be bent into a hook shape engageable with a locking edge 22 formed on a movable module 2.

In the present embodiment, the input bar 50 and the spring 51 become the input unit. The output bar 52 is the output unit. The pivotal engagement between the input bar 50 and output bar 52, and the pivotal and slideable engagement between the slot in the output bar 52 and the fulcrum 17 form the transfer unit of the present invention.

While in use under a normal condition, the device 1 is rested upon the support plane 10. The input bar 50 will be pushed upward to move the output bar 52 downward for the hook as shown to disengage with the locking edge 22 (shown by solid lines in FIG. 4). Then, the movable module 2 is unlocked and movable for any normal operation. While the device 1 is removed from the support plane 10, the spring 51 will push (or pull) the input bar 51 downward. The output bar 52 will be moved upward to make the hook engaged with the locking edge 22. Then, the movable module 2 is at a locked position shown by broken lines in FIG. 4.

Figure 5:
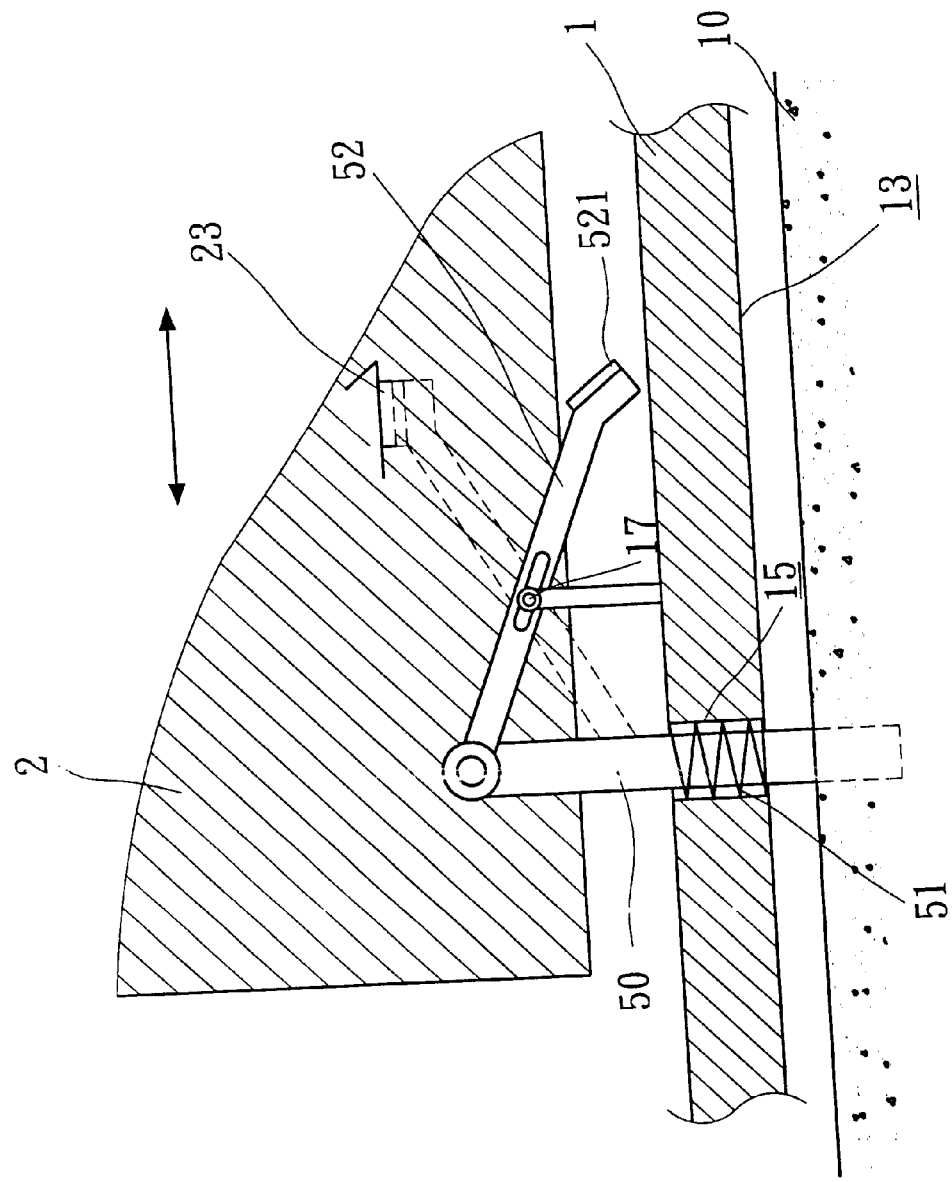
FIG. 5 is a fragmentary sectional view of a fourth embodiment of this invention.

FIG. 5 shows a fourth embodiment of this invention. It is largely constructed like the one shown in FIG. 4. However, instead of a hook on the output bar 52 and a locking edge 22 on the movable module 2, a first magnet 521 is attached to the output bar 52 for attracting a mating second magnet 23 located on the movable module 2 during the locked condition.

The spring 51 used in FIG.4 and FIG. 5 may be a compression spring, a tensile spring or a torsion spring.

By means of this invention, the device weight and position may trigger an action to lock the movable module to a fixed location. The device thus may be moved or transported without the risk of damaging the movable module or device.

It may thus be seen that the objects of the present invention set forth herein, as well as those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An automatic locking apparatus for a movable module in a device which has a bottom wall resting on a support plane under a normal state of the device, comprising:

an input unit, located on the bottom wall for detecting if the device being positioned normally;

a transfer unit, located in the device for linking with the input unit for generating a response based upon position states of the device detected by the input unit; and an output unit, located in the device for linking with the transfer unit for receiving the response to perform a selected action upon the movable module;

wherein the transfer unit triggers the output unit to release the movable module for moving inside the device as desired when the input unit detects device position is at the normal state; the transfer unit triggers the output unit to lock the movable module at a selected position when the input unit detects the position of the device is at an abnormal state.

2. The automatic locking apparatus of claim 1, wherein the input unit includes a sensor located below the bottom wall, the transfer unit includes an electric controller, and the output unit includes an actuator which has a lock pin for locking the movable module to the selected position when the sensor detects the device being positioned at the abnormal state.

3. The automatic locking apparatus of claim 2, wherein the device has a flange located between the actuator and the movable module, and the flange has a through hole for the lock pin to pass through.

4. The automatic locking apparatus of claim 2, wherein the apparatus is powered by an independent power supply.

5. The automatic locking apparatus of claim 2, wherein the sensor has a probe pin to detect if the device being positioned on the support plane.

6. The automatic locking apparatus of claim 1, wherein the bottom wall has a cavity to hold a spring and a slide bar as the transfer unit, the slide bar has a bottom end extending out of the bottom wall as the input unit and a top end formed in a lock stub manner as the output unit engageable with a locking member located in the movable module, the lock stub disengages with the locking member at the normal state in which the bottom end rests on the support plane and the spring is compressed to store spring energy, and the lock stub engages with the locking member to lock the movable module at the selected position at the abnormal state in which the bottom end is moved away from the support plane and the spring releases the stored energy.

7. The automatic locking apparatus of claim 6, wherein the lock stub is formed in a hook and the locking member is a locking bore.

8. The automatic locking apparatus of claim 6, wherein the slide bar has a low limit hook and a high limit shoulder for respectively forming a lowest dead end and a highest dead end of the slide bar movement against the bottom wall.

9. The automatic locking apparatus of claim 1, wherein the input unit includes an input bar and a spring held in an opening formed in the bottom wall, the spring has one end engaged with the input bar and another end engaged with the bottom wall, the output unit includes an output bar which has one end formed a lock member and another end pivotally engaged with a top end of the input bar to form a portion of the transfer unit, the output bar has a sliding slot pivotally engaged with a fulcrum to form another portion of the transfer unit, the movable module has a locking element disengaged with the lock member when the device is positioned on the supporting plane which presses a bottom end of the input bar to move away the lock member from the locking element so that the movable module is operationable under the normal state and the spring is storing spring energy, and the spring will release the store energy to move the bottom end outward from the bottom wall when the device is moved away from the support plane so that the lock member will engage with the locking element to lock the movable module at the selected position in the device to form the abnormal state.

10. The automatic locking apparatus of claim 9, wherein the lock member is a hook and the locking element is a locking edge.

11. The automatic locking apparatus of claim 9, wherein the lock member is a first magnet and the locking element is a second magnet attractive to the first magnet.

12. A device having an automatic locking apparatus for a movable module located in the device which has a bottom wall resting on a support plane under a normal state of the device, comprising:

an input unit, located on the bottom wall for detecting if the device being positioned normally;

a transfer unit, located in the device for linking with the input unit and generating a response based on position states of the device detected by the input unit; and an output unit, located in the device for linking with the transfer unit for receiving the response to perform a selected action on the movable module;

wherein the transfer unit triggers the output unit to release the movable module for moving in the device as desired when input unit detects a position of the device is at the normal state, and the transfer unit triggers the output unit to lock the movable module at a selected position when the input unit detects the position of the device is at an abnormal state.

13. The device of claim 12, wherein the input unit includes a sensor located below the bottom wall, the transfer unit includes an electric controller, and the output unit includes an actuator having a lock pin to lock the movable module to the selected position when the sensor detects the device being positioned at the abnormal state.

14. The device of claim 13, wherein the device has a flange located between the actuator and the movable module, and the flange has a through hole for the lock pin to pass through.

15. The device of claim 13, wherein the apparatus is powered by an independent power supply.

16. The device of claim 13, wherein the sensor has a probe pin to detect if the device being positioned on the support plane.

17. The device of claim 12, wherein the bottom wall has a cavity to hold a spring and a slide bar as the transfer unit, the slide bar has a bottom end extending out of the bottom wall as the input unit and a top end formed in a lock stub manner as the output unit engageable with a locking member located in the movable module, and the lock stub disengages with the locking member at the normal state in which the bottom end rests on the support plane and the spring is compressed to store spring energy, the lock stub engages with the locking member for locking the movable module at the selected position at the abnormal state in which the bottom end is moved away from the supporting plane and the spring releases the stored energy.

18. The device of claim 17, wherein the lock stub is formed in a hook and the locking member is a locking bore.

19. The device claim 17, wherein the slide bar has a low limit hook and a high limit shoulder for respectively forming a lowest dead end and a highest dead end of the slide bar movement against the bottom wall.

20. The device of claim 12, wherein the input unit includes an input bar and a spring held in an opening formed in the bottom wall, the spring has one end engaged with the input bar and another end engaged with the bottom wall, the output unit includes an output bar which has one end formed a lock member and another end pivotally engaged with a top end of the input bar to form a portion of the transfer unit, the output bar has a sliding slot pivotally engaged with a fulcrum to form another portion of the transfer unit, the movable module has a locking element disengaged with the lock member when the device is positioned on the support plane which presses a bottom end of the input bar to move away the lock member from the locking element so that the movable module is operationable under the normal state and the spring is storing spring energy, and the spring will release the store energy to move the bottom end outward from the bottom wall when the device is moved away from the support plane so that the lock member will engage with the locking element to lock the movable module at the selected position in the device to form the abnormal state.

21. The device of claim 20, wherein the lock member is a hook and the locking element is a locking edge.

22. The device of claim 20, the lock member is a first magnet and the locking element is a second magnet attractive to the first magnet.

* * * * *